United States Patent
Lange

(10) Patent No.: US 10,063,308 B2
(45) Date of Patent: Aug. 28, 2018

(54) RADIO FREQUENCY TRANSMITTER

(71) Applicant: CommScope Technologies LLC, Hickory, CA (US)

(72) Inventor: Keld Knut Lange, Oetisheim (DE)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/804,240

(22) Filed: Nov. 6, 2017

(65) Prior Publication Data

US 2018/0062730 A1 Mar. 1, 2018

Related U.S. Application Data

(63) Continuation of application No. 15/183,574, filed on Jun. 15, 2016, now Pat. No. 9,813,140.

(Continued)

(51) Int. Cl.
*H04B 1/04* (2006.01)
*H04B 7/14* (2006.01)
(Continued)

(52) U.S. Cl.
CPC ............ *H04B 7/14* (2013.01); *H03F 3/24* (2013.01); *H04B 1/04* (2013.01); *H04B 1/525* (2013.01);
(Continued)

(58) Field of Classification Search
CPC .. H04B 1/0053; H04B 1/0057; H04B 1/0067; H04B 1/02; H04B 1/04; H04B 1/0458; H04B 1/0483; H04B 7/06; H04B 7/14; H04B 7/155; H04B 2001/0408; H04W 72/0453; H03F 3/20; H03F 3/24
(Continued)

(56) References Cited

U.S. PATENT DOCUMENTS

| 5,539,730 A | 7/1996 | Dent |
|---|---|---|
| 2005/0174173 A1 | 8/2005 | Blodgett |

(Continued)

OTHER PUBLICATIONS

International Search Authority, "International Search Report and Written Opinion from PCT Application No. PCT/US2016/037671", "Foreign Counterpart to U.S. Appl. No. 15/183,574", dated Sep. 2, 2016, pp. 1-10, Published in: WO.
(Continued)

*Primary Examiner* — Young T Tse
(74) *Attorney, Agent, or Firm* — Fogg & Powers LLC

(57) ABSTRACT

A radio frequency transmitter device, constituted for transmitting a radio frequency signal in a frequency band comprising at least one transmit subband and at least one receive subband, comprises: a transmit chain for processing a transmit signal associated with the at least one transmit subband; a power amplifier for amplifying the transmit signal; an output port for transmitting the amplified transmit signal; a processing unit for calculating, from the transmit signal associated with the at least one transmit subband, a correction signal in the at least one receive subband making use of a power amplifier model modelling the behavior of the power amplifier; and a coupler for adding the correction signal to the amplified transmit signal for cancelling intermodulation products in the amplified transmit signal produced by the power amplifier.

20 Claims, 7 Drawing Sheets

Related U.S. Application Data

(60) Provisional application No. 62/180,094, filed on Jun. 16, 2015.

(51) Int. Cl.
*H03F 3/24* (2006.01)
*H04B 7/155* (2006.01)
*H04W 72/04* (2009.01)
*H04B 1/525* (2015.01)

(52) U.S. Cl.
CPC ........ *H04B 7/155* (2013.01); *H04W 72/0453* (2013.01); *H04B 2001/0408* (2013.01)

(58) Field of Classification Search
USPC ................ 375/211, 221, 257, 260, 295–297; 455/102, 103, 127.3
See application file for complete search history.

(56) References Cited

U.S. PATENT DOCUMENTS

| | | |
|---|---|---|
| 2006/0160502 A1 | 7/2006 | Kintis |
| 2008/0211576 A1 | 9/2008 | Moffatt et al. |
| 2009/0003308 A1 | 1/2009 | Baxley et al. |
| 2014/0146906 A1 | 5/2014 | Zavadsky et al. |
| 2014/0161159 A1 | 6/2014 | Black et al. |
| 2014/0194073 A1* | 7/2014 | Wyville .................. H04B 1/525 455/73 |
| 2015/0146765 A1* | 5/2015 | Moffatt ..................... H04B 1/62 375/219 |
| 2015/0146769 A1* | 5/2015 | Omer ................ H04L 25/03159 375/232 |
| 2016/0065147 A1* | 3/2016 | Pratt ..................... H03F 1/3247 330/75 |

OTHER PUBLICATIONS

United States Patent and Trademark Office, "Notice of Allowance for U.S. Appl. No. 15/183,574", dated Jul. 13, 2017, pp. 1-8, Published in: U.S.

United States Patent and Trademark Office, "Office Action for U.S. Appl. No. 15/183,574", dated Jan. 5, 2017, p. 1-11, Published in: U.S.

* cited by examiner

RADIO FREQUENCY TRANSMITTER

CROSS-REFERENCE TO RELATED APPLICATIONS

This is a continuation application of U.S. patent application Ser. No. 15/183,574 filed Jun. 15, 2016 and titled "Radio Frequency Transmitter," issued as U.S. Pat. No. 9,813,140, which claims the benefit of U.S. Provisional Application Ser. No. 62/180,094, filed Jun. 16, 2015, and titled "Radio Frequency Transmitter," all of which are incorporated herein by reference.

TECHNICAL FIELD

The invention generally relates to the field of telecommunications, in particular to a method and system for transmitting a radio frequency signal.

BACKGROUND

Nowadays, repeater systems are constituted to serve a wide frequency band, for example a complete 3GPP band. Herein, a frequency band typically contains multiple subbands associated with carriers carrying information according to different communication technologies and standards such as GSM, UMTS, LTE or the like.

Repeater systems, in general, are constituted to receive a signal, for example, from a base station to process the signal, to amplify the signal and to retransmit it into a coverage area to provide (enhanced) coverage for example in an obstructed area such as within a building or within a movable object such as a train. The repeater system herein receives, in a downlink direction, a signal from a telecommunication network, for example from a base station, processes the signal and retransmits it towards a user equipment (UE), in particular a mobile station. In an uplink direction, in turn, the repeater system receives a signal from a user equipment, processes the signal and transmits it towards a base station.

The repeater system provides coverage in a coverage area via an air interface. Just as well the repeater system may be coupled to one or multiple base stations of one or multiple operators via an air interface, wherein it also is possible that the repeater system is linked to base stations in a wire-bound fashion and is fed by the base stations via suitable communication links such as coaxial cables.

To retransmit RF signals into the coverage area (in the downlink direction towards a user equipment), the RF signals need to be power amplified. A power amplifier herein, generally, shall be used in the linear regime in which the RF power linearly relates to the input power. However, (active and passive) components of radio transmitters are imperfect in that they are not perfectly linear, leading to the generation of unwanted spectral products within and outside of a wanted frequency band. In a downlink direction, a power amplifier may, for example, produce intermodulation products in subbands associated with uplink carriers, leading to unwanted signals in such uplink subbands, which may be problematic because uplink signals received from a user equipment may be weak.

In wireless radio systems requirements exist to define so-called "key performance indicators" (KPI) for wireless transmission. A baseline criterion for the design of a radio amplifier is to meet the so-called "spurious emission limit" substantially for an entire frequency band of use, for example a 3GPP frequency band. This spurious emission limit can generally be achieved by a suitable design of the radio amplifier, for example by applying linearization techniques for linearizing the transfer curve of a power amplifier (such as a digital pre-distortion technique).

A more stringent spurious emission limit is defined as the so-called "co-existence limit", enabling to operate different 3GPP compliant radio transmitters in the same geographical area (for this it is assumed that a reasonable distance between radio transmitters exists). Yet another limit is defined as the so-called "co-location" limit, which allows to install radio transmitters in the same location or even sharing the same antenna.

SUMMARY OF THE INVENTION

It is an object to provide a method and a system for reducing unwanted spectral products in one or multiple receive bands.

In one aspect, a method for transmitting a radio frequency signal in a frequency band comprising at least one transmit subband and at least one receive subband is provided. The method comprises the steps of: processing a transmit signal associated with the at least one transmit subband in a transmit chain; amplifying the transmit signal using a power amplifier; transmitting the amplified transmit signal via an output port; calculating, from the transmit signal associated with the at least one transmit subband, a correction signal in the at least one receive subband making use of a power amplifier model modelling the behavior of the power amplifier; and adding the correction signal to the amplified transmit signal prior to the transmission for cancelling intermodulation products in the amplified transmit signal produced by the power amplifier.

The power amplifier model may for example be a memoryless amplifier model, as it is described for example by R. Pasricha et al., "Memoryless non linear modelling of power amplifier", International Journal of Electronics Engineering, 2 (1), 2010, pp. 55-58, which shall be incorporated by reference herein.

The power amplifier model may, in particular, be constituted to output an output signal indicative of the amplified transmit signal. For producing the correction signal, the power amplifier model, hence, produces an output signal which models the amplified transmit signal as it would be output by the power amplifier when amplifying the transmit signal. In order to obtain the correction signal, the transmit signal (as sent to the transmitter) may be subtracted from the output signal of the power amplifier model, such that the correction signal contains only the intermodulation products produced by the power amplifier due to its non-linear characteristic, but does not contain the (wanted) transmit signal.

Prior to adding the correction signal to the amplified transmit signal, it, in one embodiment, is processed by means of a processing unit. Herein, the correction signal may, for example, be passed through the at least one filter for cancelling components outside of the at least one receive subband. The correction signal, hence, contains the intermodulation products only within the one or the multiple receive bands, which shall not be disturbed by the intermodulation products produced by the power amplifier.

The correction signal, in general, may have a smaller dynamic range than the transmit signal. For example, the transmit signal may have a dynamic range between 60 and 80 dB, whereas the correction signal has a dynamic range between 10 and 30 dB, for example 20 dB. Because the dynamic range of the correction signal is small, components of a processing chain for the correction signal may be simple and cheap.

In one embodiment, for calculating the correction signal the transmit signal may be sent to the processing unit as a complex data stream representing for example a base band signal. The data stream may, for example, be modulated in the processing unit to generate a real signal using a suitable modulator. The real signal represents the actual RF transmit signal which shall be transmitted from the transmitter device.

The correction signal is produced by subtracting the output signal of the power amplifier model and the transmit signal from each other. The correction signal may then be processed in a processing chain by splitting it into individual signals associated with a multiplicity of receive subbands. Each of the individual signals may be demodulated and filtered using, for example, a digital filtering in the base band. After adapting the sample rate (for example by downsampling the individual signals and subsequently up-sampling the signals), the individual signals are modulated and combined and are, after combining, converted into an analog signal using a digital-to-analog converter, for example a 1-bit converter.

The up-sampling, modulation and digital-to-analog conversion herein may be carried out using a parallel processing scheme. The digital-to-analog converter may, for example, operate at a sample rate of 10 Gsamples/s, wherein the operating clock rate may be reduced by applying a parallel processing technique.

In another aspect, a radio frequency transmitter device for transmitting a radio frequency signal in a frequency band comprising at least one transmit subband and at least one receive subband is provided. The radio frequency transmitter device comprises: a transmit chain for processing a transmit signal associated with the at least one transmit subband; a power amplifier for amplifying the transmit signal; an output port for transmitting the amplified transmit signal; a processing unit for calculating, from the transmit signal associated with the at least one transmit subband, a correction signal in the at least one receive subband making use of a power amplifier model modelling the behaviour of the power amplifier; and a coupler for adding the correction signal to the amplified transmit signal for cancelling intermodulation products in the amplified transmit signal produced by the power amplifier.

In another aspect, a digital repeater system for transmitting signals is provided. The digital repeater system comprises a transmitter device of the type described above. The digital repeater system may, in one embodiment, for example be implemented as a distributed system, in particular a distributed antenna system (in short: DAS). For example, the digital repeater system may comprise a host unit and one or multiple remote units connected to the host unit via a transport medium. In this set-up, the host unit may for example be located at a central location, for example on or within a building, wherein the remote units provide coverage in one or multiple coverage areas, for example throughout different floors of a building. The transmitter device may in this example be installed for example in the remote units or may be distributed over the remote units and the host unit in that at least a portion of the processing is performed within the host unit or within an intermediate unit such as a so-called extension unit connecting the host unit to one or multiple remote units.

BRIEF DESCRIPTION OF THE DRAWINGS

The various features and advantages of the present invention may be more readily understood with reference to the following detailed description and the embodiments shown in the drawings. Herein.

DETAILED DESCRIPTION

Figure 1:
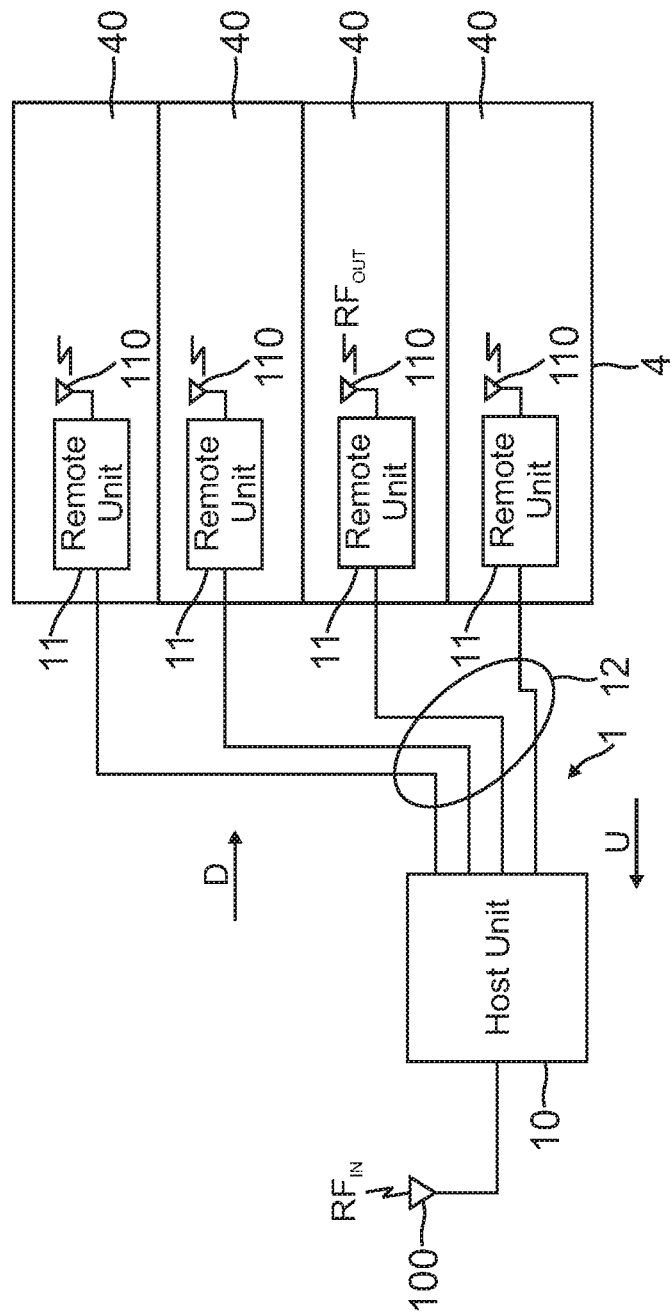
FIG. 1 shows a schematic overview of a digital repeater system comprising a host unit connected to multiple remote units.

Subsequently, embodiments of the invention shall be described in detail with reference to the drawings. In the drawings, like reference numerals designate like structural elements.

It is to be noted that the embodiments are not limiting for the invention, but merely represent illustrative examples.

FIG. 1 shows, in a schematic drawing, an embodiment of a digital repeater system 1 comprising a host unit 10 and multiple remote units 11. The host unit 10 may for example be located outside a building 4 and comprises an antenna 100 via which the host unit 10 is for example connected to one or multiple base stations of one or multiple communication networks using, for example, an air interface. The remote units 11 are located on different floors 40 of the building 4 and serve to provide coverage throughout the different floors 40 of the building 4. The remote units 11 are connected to the host unit 10 via a transport medium 12, for example a network of optical fibers, and hence are in communication connection with the host unit 10. Each remote unit 11 comprises an antenna 110 via which the remote unit 11 for example is connected to a mobile device of a user on a floor 40 of the building 4.

The host unit 10 in the shown embodiment is connected with one or multiple base stations of one or multiple operators of one or multiple communication networks via an air interface. It however is also possible that the host unit 10 is connected to the base stations in a wire-bound fashion, the base stations feeding for example digital data into the host unit 10 and receiving data from the host unit 10 via a data link such as a coaxial cable connection or the like.

Figure 2:
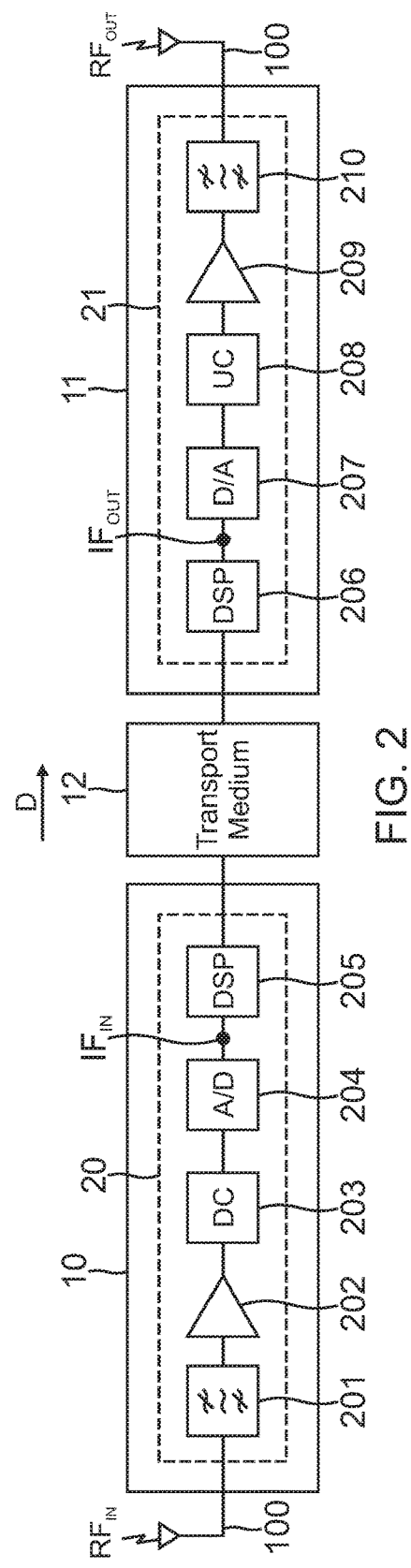
FIG. 2 shows a schematic drawing showing functional processing blocks in the host unit and a remote unit for digital processing of an RF signal in a downlink direction.

In the embodiment of FIG. 2, in a downlink direction D an RF input signal $RF_{IN}$ is received via the antenna 100 at the host unit 10, is processed within the host unit 10 for transporting it via the transport medium 12 to the different remote units 11 and, after further processing, is send out via the antennas 110 as an RF output signal $RF_{OUT}$. The RF output signal $RF_{OUT}$ may be received by a mobile device in the building 4.

Vice versa, in an uplink direction an RF signal received at the antenna 110 of a remote unit 11 is fed via the transport medium 12 to the host unit 10 and is retransmitted via the antenna 100 towards an outside communication network.

The digital repeater system 1 performs a digital processing of the RF signal, as functionally shown in FIG. 2. FIG. 2 herein depicts such functional entities of the host unit 10 and a remote unit 11 connected via the transport medium 12 to the host unit 10 which are used in the downlink direction D for processing the RF input signal $RF_{IN}$ for retransmission.

In the embodiment of FIG. 2, the host unit 10 comprises a receiving section 20 for processing an RF input signal $RF_{IN}$ received by the antenna 100. In particular, the receiving section 20 comprises an RF filter 201 in the shape of a bandpass filter for filtering out a frequency band to be processed and transported for retransmission. From the RF filter 201 the RF input signal $RF_{IN}$ is fed to a low noise amplifier 202 and to a downconverter 203 for downconverting the RF signal into an intermediate frequency band. After that, the signal is fed to an analog-to-digital converter 204 for digitizing the RF signal, such that an (intermediate-frequency) digital signal $IF_{IN}$ is obtained.

The digital signal $IF_{IN}$ is fed to a digital signal processing unit (in the shape of a DSP, an FPGA or the like) 205 and is digitally processed in the digital signal processor 205. The digital processing unit 205 may in particular channelize the digital signal $IF_{IN}$ to process carrier signals of communication channels contained in the digital signal $IF_{IN}$ separately, in particular to filter and optimize the carrier signals.

After digital signal processing, the processed signal is, via the transport medium 12, transported to a digital signal processor 206 of a transmitting section 21 of a remote unit 11, in which the signal is further processed such that a digital signal $IF_{OUT}$ in the intermediate frequency range is obtained. This digital signal $IF_{OUT}$ is converted to an analog RF signal by means of a digital-to-analog converter 207, is upconverted by an upconverter 208, is power-amplified by a power amplifier 209, is filtered by an RF filter 210 in the shape of a bandpass filter and is transmitted as an RF output signal $RF_{OUT}$ via the antenna 110 of the remote unit 11.

In the uplink direction U, essentially the same takes place, wherein in that case an RF input signal is received and processed by an receiving section 20 of a remote unit 11 and is further processed and transmitted via a transmitting section 21 of the host unit 10.

In the example shown in FIG. 2, the transmitting section 21 comprises a power amplifier 209 for power amplification of an RF signal for transmission. A transmitting section 21 of this kind is placed in each remote unit 11 to retransmit output RF signals $RF_{OUT}$ into different coverage areas 40 associated with the remote units 11 in the downlink direction D. A transmitting section 21 of a similar kind may also be located in the host unit 10 in order to power amplify and transmit RF signals from the host unit 10 towards one or multiple base stations of one or multiple outside telecommunication networks via an air interface.

The power amplifier 209 generally is to be operated in the linear regime in order to avoid non-linear distortions of the RF signals. For this, the power amplifier 209 is operated with a backoff from its saturation point, wherein the backoff generally must be chosen according to the peak-to-average ratio (PAR) of the RF signals to be amplified.

Generally, the choice of the back-off is a trade-off between the quality of the output signal and the efficiency of the power amplifier 209. If the back-off is chosen to be large, the power amplifier 209 will exhibit a reduced efficiency. If in contrast the back-off is chosen to be small, non-linear distortions of the output signal will increase. In any case, non-linear distortions in the output signal of the power amplifier 209 cannot be avoided.

In the example of FIG. 2, the power amplifier 209 of the transmit section 21 serves to power amplify a transmit signal for transmission via the antenna 110 into a coverage area associated with the remote unit 11, for example corresponding to a floor 40 of a building 4. The transmit signal may reside in one or multiple transmit subbands of a frequency band, for example corresponding to a 3GPP frequency band. At the same time, receive signals are to be received at the remote unit 11 in an uplink direction U in one or multiple uplink receive subbands of the frequency band.

It in general is desired that spurious emissions in the downlink direction, due to intermodulation products for example generated by the power amplifier 209, shall not disturb receive signals in the receive subbands, because this may di-sensitize the receiving section 20 of the remote unit 11.

Figure 3:
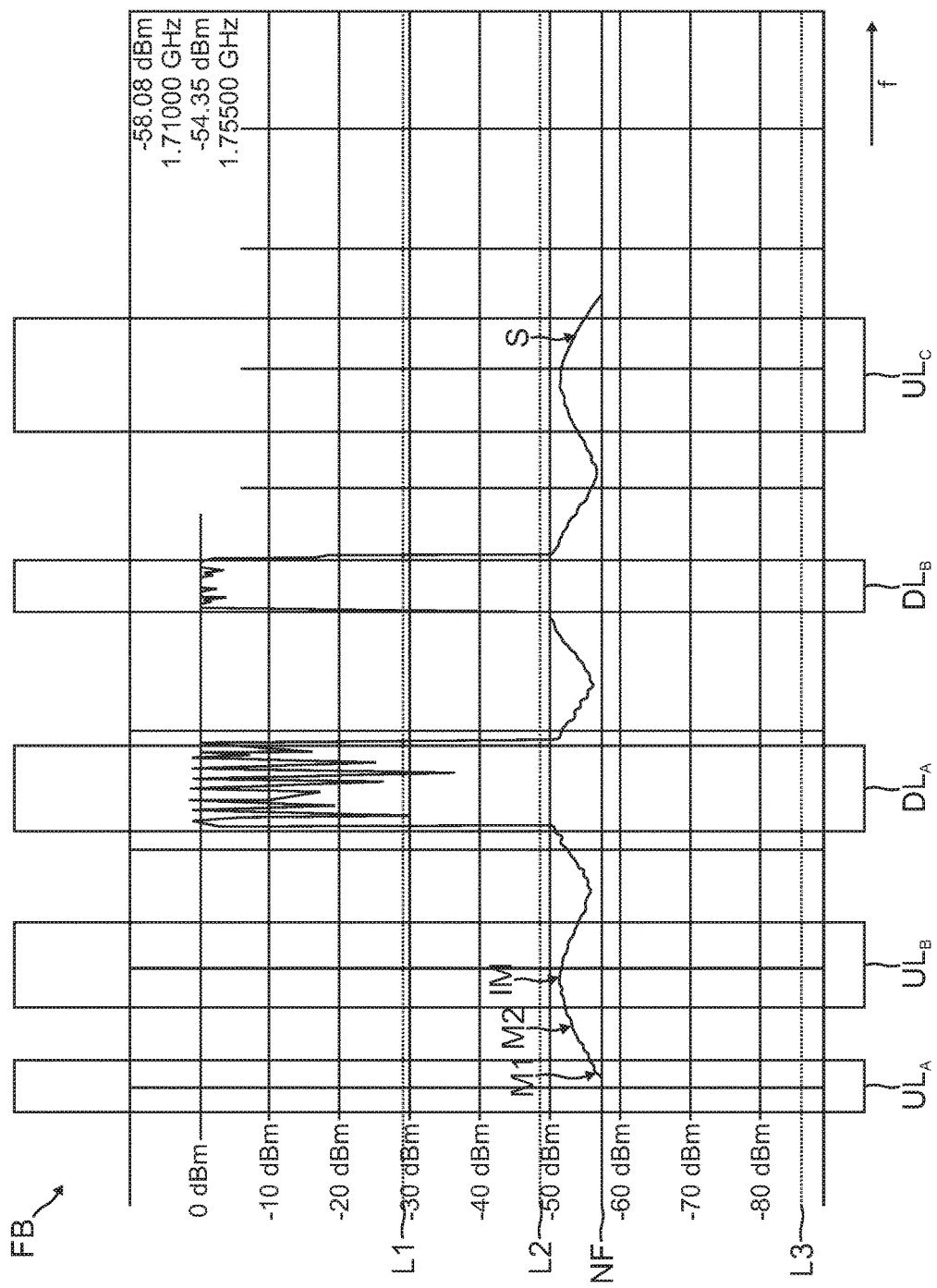
FIG. 3 shows a diagram of a signal in a frequency range comprising multiple subbands.

A diagram of a signal S in a frequency band FB is shown in FIG. 3. The frequency band in the shown example includes multiple 3GPP bands in the range between for example 1.7 GHz and 2.2 GHz and, in the shown example, contains two downlink subbands $DL_A$, $DL_B$ and three uplink subbands $UL_A$-$UL_C$. The different subbands $DL_A$, $DL_B$, $UL_A$-$UL_C$ are distinct in frequency f. The downlink subbands $DL_A$, $DL_B$ correspond to transmit subbands at a remote unit 11, whereas the uplink subbands $UL_A$-$UL_C$ correspond to receive subbands at the remote unit 11.

The signal S corresponds to a transmit signal to be transmitted from the remote unit 11 via the antenna 110 into a coverage area 40. Correspondingly, the signal S has predominant spectral content in the downlink subbands $DL_A$, $DL_B$.

The signal S corresponds to the output signal of the power amplifier 209. Because the power amplifier 209 does not comprise a perfectly linear characteristic, the power amplification of the transmit signal fed to the power amplifier 209 will lead to intermodulation products IM, which are visible also in the receive subbands corresponding to the uplink subbands $UL_A$-$UL_C$. This is visible in FIG. 3 in the shape of the wave-like curve occurring throughout the entire frequency band FB and having spectral contents also in the uplink subbands $UL_A$-$UL_C$.

In general, limits L1, L2, L3 are defined for spurious emissions by the power amplifier 209. The limit L1 corresponds to a spurious emission limit called the "Cat.B limit". The limit L2 corresponds to a so-called "co-existence limit", and the limit L3 corresponds to a so-called "co-location limit". The co-existence limit L2, for example, is defined in such a way that different 3GPP compliant radio transmitters may be operated in the same geographical area (assuming a reasonable distance in-between the radio transmitters). The co-location limit L3 in turn is defined such that radio transmitters may be installed at the same location and may even share the same antenna. Consequently, the co-location limit is the most stringent limit of the three limits L1-L3.

Also indicated in FIG. 3 is a noise-floor NF corresponding to the noise floor of the transmitting section 21.

It is desired to cancel out the intermodulation products IM in the receive subbands (corresponding to the uplink subbands $UL_A$-$UL_C$). Hence, in one aspect, a correction signal is produced corresponding to the inverse intermodulation products and is added to the output signal of the power amplifier 209 such that the intermodulation products IM are cancelled out in the transmission signal to be transmitted via the antenna 110.

The correction signal serving as the cancellation signal may have a large bandwidth corresponding to the entire bandwidth of the repeater system 1, for example from 400 MHz to 3.800 MHz. The dynamic range of the correction signal can be very small because, as visible in FIG. 3, the intermodulation products IM have a fairly small dynamic range (in the example of FIG. 3 roughly 10 dB). The noise floor of the correction signal shall be lower than the transmitter noise floor NF including the coupling loss (e.g. 10 dB or lower), while the power of the correction signal is equivalent to the power of the intermodulation products IM in the receive bands, corresponding to the uplink subbands $UL_A$-$UL_C$ plus the coupling loss.

Figure 4:
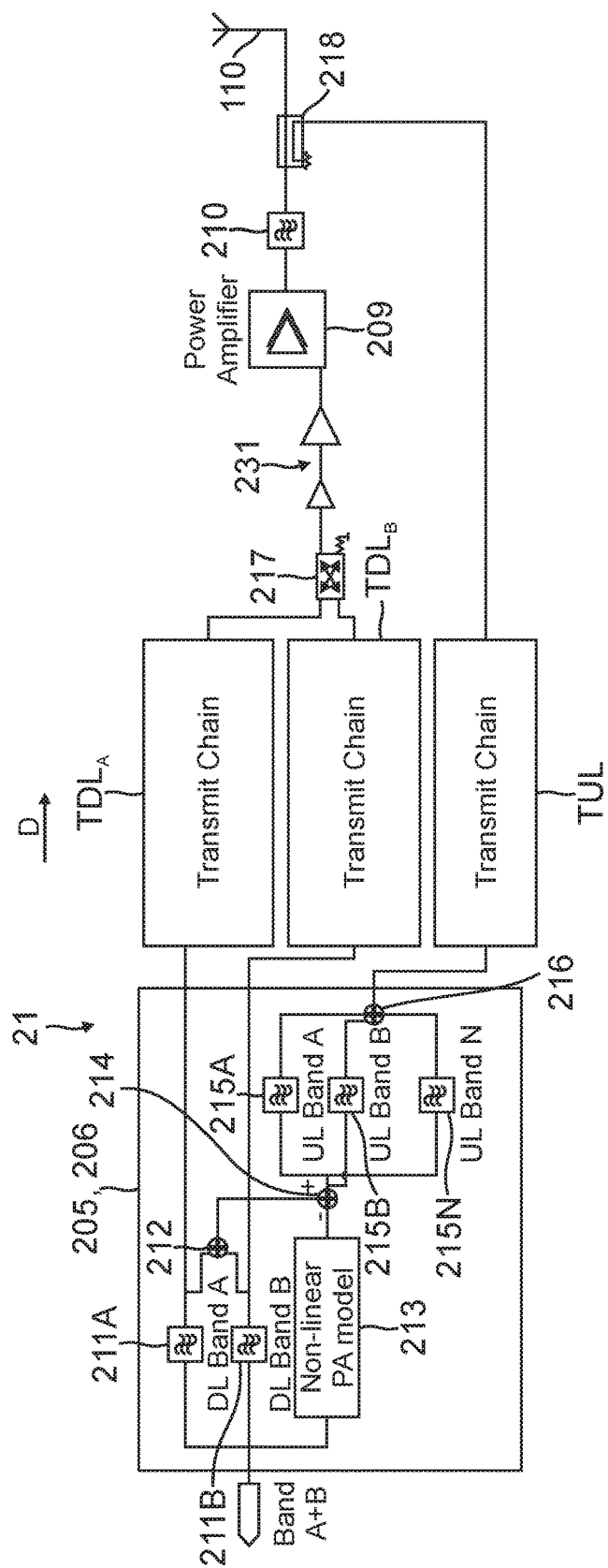
FIG. 4 shows a schematic drawing of a transmitter device for transmitting a transmit signal.

An embodiment of a transmitter section 21, for example located in a remote unit 11, is shown in FIG. 4, wherein it is conceivable that portions of the arrangement of FIG. 4 are also distributed over the host unit 10 and the remote unit 11 or the host unit 10, an intermediate unit (also called extension unit) in-between the host unit 10 and the remote unit 11 and the remote unit 11.

The transmit section 21 receives a transmit signal, for example in the shape of a digital data stream. This data stream is fed (in FIG. 4 from the left) into a digital processing unit 205, 206, which may reside in the host unit 10 or in the remote unit 11 or which may be distributed over both and possibly also over an intermediate unit in-between the host unit 10 and the remote unit 11. In the processing unit 205, 206 the data stream is passed through filters $211_A$, $211_B$ associated with the two transmit subbands $DL_A$, $DL_B$ and is further passed through transmit chains $TDL_A$, $TDL_B$ in which a further processing, for example a digital filtering and conditioning of the respective transmit signals in the downlink subband $DL_A$ and the downlink subband $DL_B$ may take place. Subsequently, the transmit signals are coupled in a cross-coupler 217 and are passed to a power amplifier 209 for power amplification. Prior to power amplification in the power amplifier 209, the transmit signals are pre-amplified in pre-amplification stages 231. In this regard it can be assumed that the pre-amplification stages 231 have a significantly better linearity than the power amplifier 209, but may also contribute to the generation of intermodulation products IM. If this is the case, their contribution is also modelled by the power amplifier model 213.

The transmit signal is passed to the power amplifier 209 as an analog RF signal and within the transmit chains $TDL_A$, $TDL_B$ for this purpose is converted from a digital to an analog signal. Upon power amplification, the transmit signal is passed through an RF filter 210, for example a wideband lowpass filter with a cut-off frequency larger than 3.8 GHz, for transmission via the antenna 110.

In a parallel path, the transmit signal fed into the processing unit 205, 206 in the shape of a digital data stream is passed to a non-linear power amplifier model 213 serving to model the behaviour of the power amplifier 209. At the output of the non-linear power amplifier model 213 a signal is produced which is indicative of the output signal of the power amplifier 209, including the power amplified wanted transmit signals in the downlink subbands $DL_A$, $DL_B$ and also including the intermodulation products in the receive uplink subbands $UL_A$-$UL_C$. By inverting the output signal and by combining it with the transmit signal of the transmit downlink subbands $DL_A$, $DL_B$ (produced by combining the corresponding data streams in combiner 212) a correction signal is obtained which corresponds to the intermodulation products IM as visible in FIG. 3, but does not contain the wanted transmit signal in the transmit downlink subbands $DL_A$, $DL_B$.

The non-linear power amplifier model 213 serves to produce an output signal which corresponds to the output of the power amplifier 209. By adding the downlink signals of the downlink subbands $DL_A$, $DL_B$ by means of a combiner 214, the correction signal containing the intermodulation products IM is produced. This two-stage approach (calculating the output signal in the non-linear power amplifier model 213 and subsequently subtracting the wanted transmit signals) may lead to a reduction in the complexity of subsequent uplink band filters $215_A$-$215_N$ compared to an approach in which the uplink band filters $215_A$-$215_N$ are directly fed by the output of the power amplifier model 213.

The thus obtained correction signal is passed through a filter bank of filters $215_A$-$215_N$ associated with the various receive uplink subbands $UL_A$-$UL_C$ (wherein in general N uplink subbands may be present). The filters $215_A$-$215_N$ serve to suppress all components of the correction signal that do not harm the receive signals in the uplink subbands $UL_A$-$UL_C$, i.e., all components outside of the uplink subbands $UL_A$-$UL_C$. This leads to a power reduction in the correction signal, which may be beneficial for the dynamic range requirements of a subsequent transmit chain TUL through which the correction signal is passed.

After filtering by the filters $215_A$-$215_N$ the correction signal is reconstructed by combining it in combiner 216. The thus obtained correction signal is then passed through a transmit chain TUL, in which it is processed and converted from a digital signal to an analog signal such that the transmit chain TUL outputs an analog RF signal which is coupled by a coupler 218 to the amplified transmit signal output by the power amplifier 209.

By coupling the correction signal to the wanted transmit signal output from the power amplifier 209, the intermodulation products IM are cancelled in the amplified transmit signal.

The filters $215_A$-$215_N$ may, in one aspect, be used to realize an ultra-broadband equalizer. This may be needed to correct linear distortions in the broadband transmit chains for the downlink subbands $DL_A$, $DL_B$ and the ultra-broadband transmit chain TUL.

Furthermore, it may be necessary to correct a delay and/or gain difference in between the different paths, i.e., the paths via the transmit chains $TDL_A$, $TDL_B$ on the one hand and via the transmit chain TUL on the other hand. This may also be achieved by the filters $215_A$-$215_N$.

The transmit chain TUL for the correction signal has an ultra-broad bandwidth, for example, from 200 MHz to 3.8 GHz. The correction signal may have a low dynamic range, for example of 20 dB. The dynamic range requirements for the correction signal herein may be further relaxed by reducing the peak-to-average ratio (PAR) by applying techniques like a hard clipping, a soft clipping or a crest factor reduction.

The bandwidth of the transmit chains $TDL_A$, $TDL_B$ may be smaller than the bandwidth of the transmit chain TUL. The downlink subbands $DL_A$, $DL_B$ may for example have a bandwidth of 100 MHz in the frequency band FB in-between 400 MHz to 3.8 GHz. The transmit signals to be passed through the transmit chains $TDL_A$, $TDL_B$, however, have a large dynamic range, for example larger than 70 dB.

Figure 5:
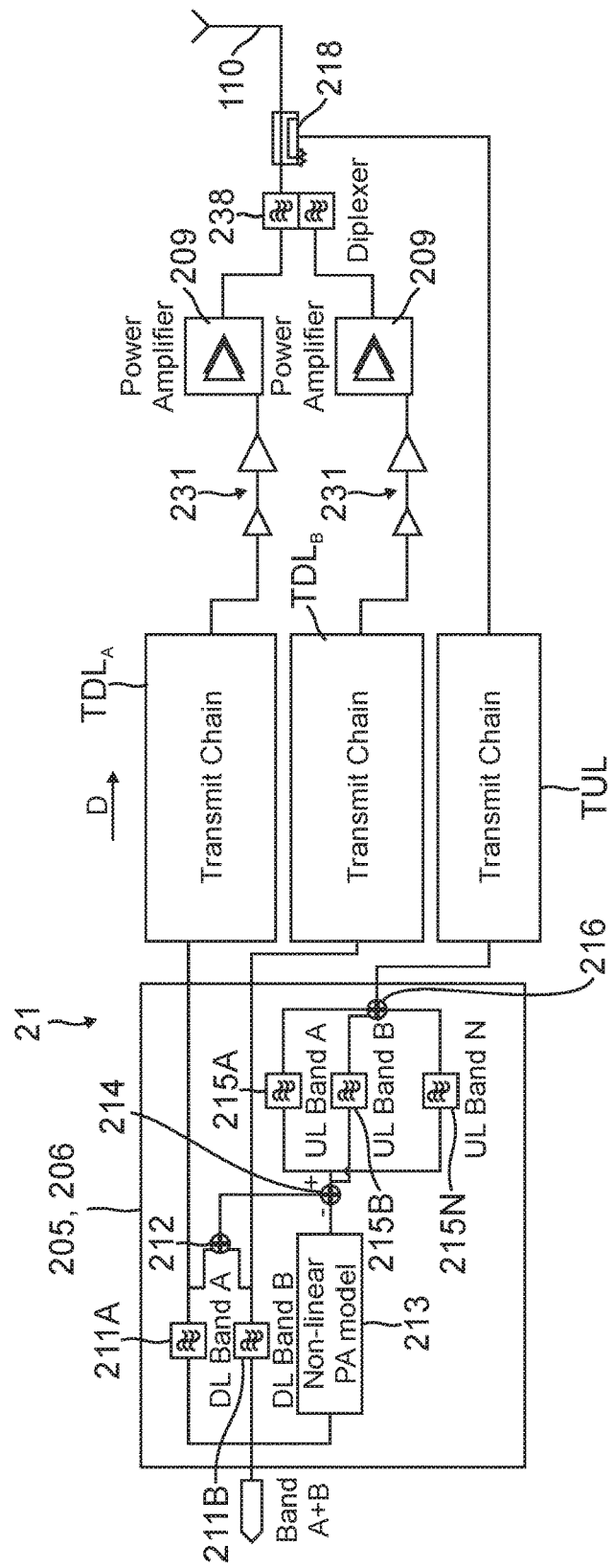
FIG. 5 shows a schematic drawing of another embodiment of a transmitter device.

An alternative embodiment is shown in FIG. 5 which differs from the embodiment of FIG. 4 in that two separate power amplifiers 209 are used for the separate transmit signals corresponding to the downlink subbands $DL_A$, $DL_B$. The amplified transmit signals are fed through an output diplexer 238 and subsequently are coupled with the correction signal for cancelling out intermodulation products in the received uplink subbands $UL_A$-$UL_C$.

It is to be noted that the non-linear power amplifier model 213 for the two power amplifiers 209 used in the embodiment of FIG. 5 is different than the power amplifier model 213 used for the single power amplifier 209 as in the embodiment of FIG. 4. Since crossband intermodulation products between the downlink subbands $DL_A$, DLB do not exist, the power amplifier model 213 in the embodiment of FIG. 5 consists of two independent sub-models for the power amplifiers 209 associated with the different downlink subbands $DL_A$, $DL_B$.

Other than that, the embodiment of FIG. 5 is functionally identical to the embodiment of FIG. 4 as described above such that it shall be referred to the above.

Figure 6:
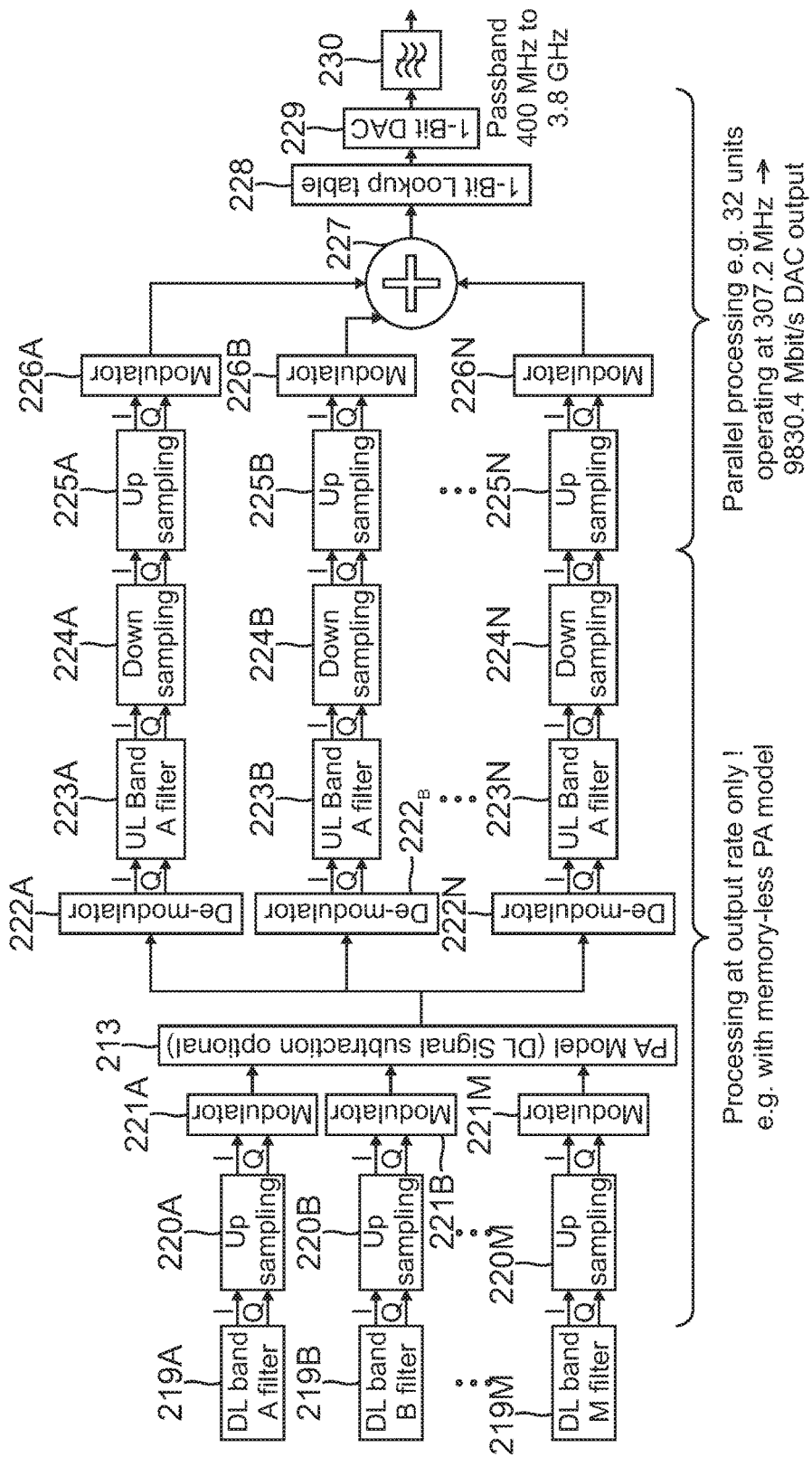
FIG. 6 shows a schematic drawing of a processing chain from producing a correction signal for cancelling intermodulation signals in a wanted transmit signal.

FIG. 6 shows an embodiment of a processing chain for producing a correction signal that shall be coupled to the amplified transmit signal for cancelling the intermodulation products IM used by the power amplifier 209.

It shall be noted that FIG. 6 illustrates just one possible embodiment of a processing chain for producing a correction signal. Modifications are possible, including for example different combinations of real and complex signal representations.

In the embodiment of FIG. 6, it is assumed that the wanted transmit signals of the downlink subbands $DL_A$, $DL_B$ are fed as a digital base band complex data stream having an in-phase component I and a quadrature component Q. Such transmit signals are fed through filters $219_A$-$219_M$ (assuming that M downlink subbands may be present). The data streams corresponding to the different transmit signals in the different downlink subbands may have a low sampling rate.

The downlink transmit signals are filtered in the filters $219_A$-$219_M$. Subsequently their sampling rate is up-sampled to an appropriate sampling rate for a combined signal (e.g., 5 Gsample/s) in converters 220, $220_M$, and the transmit signals are converted to real signals in modulators $221_A$-$221_M$ having for example the shape of Hilbert modulators. The sampling rate of the real signals output by the modulators $221_A$-$221_M$ may for example be at 10 Gsample/s.

The real signals are fed to the power amplifier model 213, which, in this case, may optionally be constituted to already perform a subtraction of the wanted downlink transmit signals, as performed in the embodiments of FIG. 4 and FIG. 5 by the combiner 214.

The power amplifier model 213 produces a correction signal at its output containing the intermodulation products IM. Assuming that the power amplifier 209 used in the transmit section 21 is highly linear, a simple memoryless power amplifier model may be used, which operates by summing the receive uplink band signals in the uplink subbands and by calculating the third order intermodulation terms.

One simple model for calculating the third order intermodulation terms by the power amplifier model 213 may make for example use of the equation $$IM=(\Sigma_i S_i)^3,$$

wherein IM denotes the third-order intermodulation products and $S_i$ denotes the output signal of the i-th modulator $221A$-$221_M$, which are summed and cubed.

A more involved power amplifier model is for example described in R. Pasricha et al., "Memoryless non linear modelling of power amplifier", International Journal of Electronics Engineering, 2 (1), 2010, pp. 55-58, which shall be incorporated by reference herein.

The correction signal as output by the power amplifier model 213 is subsequently split into individual signals corresponding to the uplink subbands $UL_A$-$UL_C$, which are fed to demodulators $222_A$-$222_N$ performing a complex demodulation to obtain in-phase and quadrature components I, Q. The individual complex signals are subsequently filtered in filters $223_A$-$223_N$ and are down-sampled by down-samplers $224_A$-$224_N$, for example according to the requirements of the Shannon theorem.

The processing until this point including, in particular, the processing within the power amplifier model 213 is to be done at the output sample rate. Subsequent processing, in turn, may be done in parallel, for example by using a multiplicity of units (for example 32 units) in parallel, each operating at a reduced sample rate, allowing to use a reduced operating clock rate of for example 307.2 MHz for a digital-to-analog converter at a sample rate of 9,8304 Gsample/s.

From the down-samplers $224_A$-$224_N$ the complex individual signals are passed to up-sampler $225_A$-$225_N$ to adapt their sample rate for modulation in subsequent modulators $226_A$-$226_N$. The modulator $226_A$-$226_N$ produce real output signals, which are combined in a combiner 227 and are fed to a 1-bit lookup table 228 generating a 1-bit information stream towards a 1-bit digital-to-analog converter 229. The lookup table 228 is used to invert the signal output from the combiner 227 and to apply a non-linear transfer curve for a soft-clipping approach. All blocks operate at a sample rate of 10 Gsamples/s (wherein the clock rate may be reduced by using a parallel approach).

By means of the 1-bit digital-to-analog converter 229, the digital signal is converted into an analog RF signal. This analog RF signal is passed through an analog filter 230, which is used to clean the output signal and to limit the output spectrum (e.g. from 400 MHz to 3.8 GHz).

Assuming that the total bandwidth of all receive bands is about 500 MHz, the processing gain of a 10 Gsample/s digital-to-analog converter 229 may be about 10 dB, resulting in a signal-to-noise ratio to 17.6 dB.

In an alternative embodiment, a comparator may be used instead of the 1-bit lookup table 228 for generating a 1-bit information stream towards the 1-bit digital-to-analog converter 229.

The RF signal output from the filter 230 is fed to the coupler 218 as shown in FIG. 4 and FIG. 5 and is coupled to the amplified transmit signal output from the power amplifier 209. The signal output from the processing chain as depicted in FIG. 6 contains the intermodulation products IM in the receive uplink subbands $UL_A$-$UL_N$. By adding this signal to the transmit signal as output from the power amplifier 209, the intermodulation products are cancelled from the amplified transmit signal output from the power amplifier 209, such that intermodulation products contained in the transmission signal in the receive uplink subbands $UL_A$-$UL_N$ is reduced.

Figure 7:
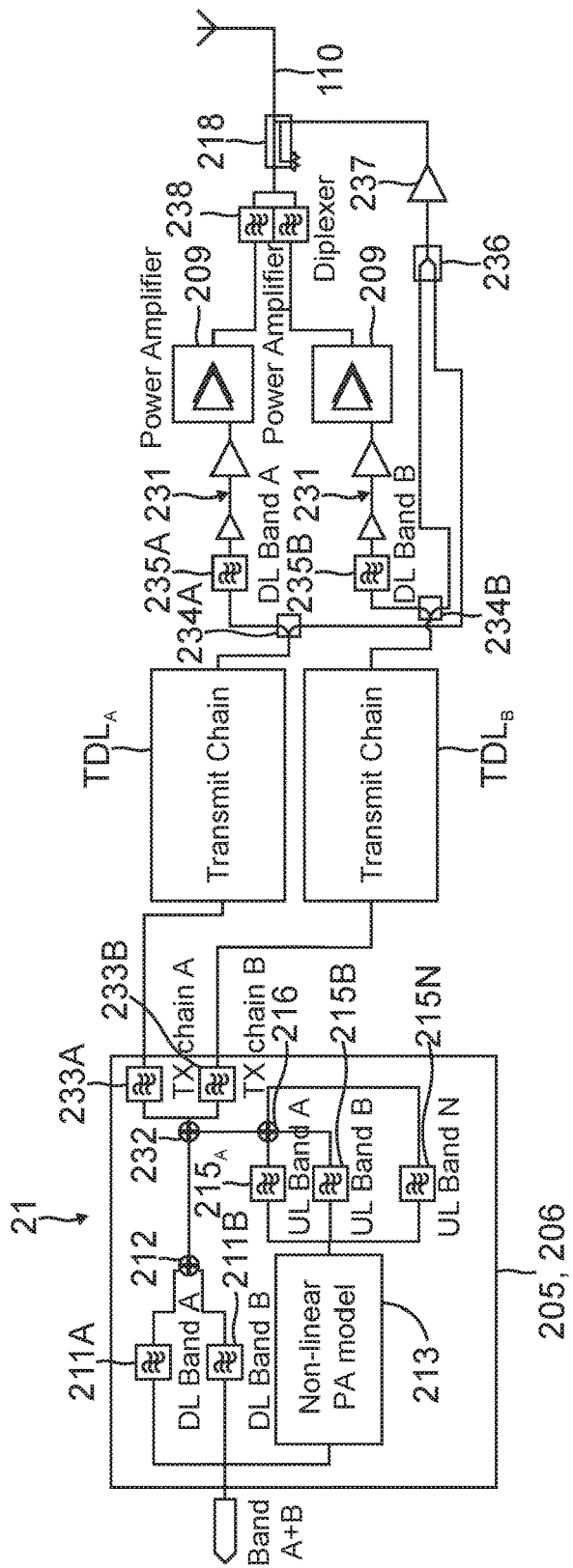
FIG. 7 shows a schematic drawing of another embodiment of a transmitter device for transmitting a transmit signal.

FIG. 7 shows another embodiment of a transmitter section 21, which for example may be located in a remote unit 11 or which may be distributed over the host unit 10 and the remote unit 11 or the host unit 10, an intermediate unit (in-between the host unit 10 and the remote unit 11) and the remote unit 11.

The transmit section 21 receives a transmit signal, for example in the shape of a digital data stream, as it is the case also in the embodiment of FIG. 4. The digital data stream is fed to a digital processing unit 205, 206, in which the digital data stream is processed and conditioned for subsequent transmission via transmit chains $TDL_A$, $TDL_B$. For this, the data stream is passed through filters $211_A$, $211_B$ having a passband corresponding to the wanted transmit subbands $DL_A$, $DL_B$ (see the example of FIG. 3). The output of the filters $211_A$, $211_B$ are combined in a combiner 212.

In parallel, the digital data stream is fed to a non-linear power amplifier model 213 serving to model the behaviour of the power amplifier 209, as it has been described in conjunction with the embodiment of FIG. 4. The power amplifier model 213 outputs a signal which is indicative of the output signal of the power amplifier 209, including the power amplified wanted transmit signals in the downlink subbands $DL_A$, $DL_B$ and also including the intermodulation products IM in the received uplink subbands $UL_A$-$UL_C$.

In the instant embodiment, the output of the power amplifier model 213 is passed through filters $215_A$-$215_N$ whose passbands correspond to the uplink subbands $UL_A$-$UL_C$ (wherein in general N uplink subbands may be present). The filters $215_A$-$215_N$ serve to suppress all components of the correction signal output by the power amplifier model 213 outside of the uplink subbands $UL_A$-$UL_C$ and which consequently do not harm the receive signals in the uplink subbands $UL_A$-$UL_C$. The filtered signals are combined in a combiner 216 and are further combined in a combiner 232 with the data stream of the wanted transmit signals, i.e., the signals corresponding to the downlink subbands $DL_A$, $DL_B$.

In a slightly modified embodiment it is also possible to add the downlink signals of the downlink subbands $DL_A$, $DL_B$ by means of a suitable combiner to the output of the power amplifier model 213, hence leading to the production of a correction signal containing the intermodulation products IM, but not the wanted transmit signals in the downlink subbands $DL_A$, $DL_B$, as it is shown in the embodiment of FIG. 4. This two-stage approach (calculating the output signal in the non-linear power amplifier model 213 and subsequently subtracting the wanted transmit signals) may lead to a reduction in the complexity of subsequent uplink band filters $215_A$-$215_N$ compared to an approach in which the uplink band filters $215_A$-$215_N$ are directly fed by the output of the power amplifier model 213, as it has been described above in connection with the embodiment of FIG. 4.

In the embodiment of FIG. 7, the wanted transmit signals corresponding to the signals in the downlink subbands $DL_A$, $DL_B$ are transmitted together with the correction signal produced by the power amplifier model 213 via transmit chains $TDL_A$, $TDL_B$. For this, the combined signal output from the combiner 232 is passed through filters $233_A$, $233_B$ whose passbands correspond to the bands of the subsequent (broadband) transmit chains $TDL_A$, $TDL_B$. The transmit chains $TDL_A$, $TDL_B$ have a broad bandwidth of for example 500 MHz (in an overall frequency range between 400 MHz and 3.8 GHz) and have a fairly large dynamic range of for example larger than 70 dBc. By means of the filters $233_A$, $233_B$ the signals are filtered to suppress signal components outside of the band of the respective transmit chain $TDL_A$, $TDL_B$.

Each transmit chain $TDL_A$, $TDL_B$ is associated with a downlink subband $DL_A$, $DL_B$. The bands of the transmit chains $TDL_A$, $TDL_B$ herein are distinct in frequency, wherein one band may reside in an upper range of the overall frequency band (between 400 MHz and 3.8 GHz) and the other band may reside in a lower range of the overall frequency band.

In the instant embodiment, the wanted transmit signals and the correction signal are passed via the same transmit chains $TDL_A$, $TDL_B$. Within the transmit chains $TDL_A$, $TDL_B$ a further processing, for example a digital filtering, may take place. Further, within the transmit chains $TDL_A$, $TDL_B$ a digital-to-analog conversion takes place such that analog RF signals are output from the transmit chains $TDL_A$, $TDL_B$.

The transmit chains $TDL_A$, $TDL_B$ each have a rather broad bandwidth of for example 500 MHz. The bandwidth of the transmit chains $TDL_A$, $TDL_B$ is larger than the bandwidth of the downlink subbands $DL_A$, $DL_B$, such that the correction signal output from the power amplifier models 213 and having frequency components in the receive uplink subbands $UL_A$-$UL_C$ may also be transmitted via the transmit chains $TDL_A$, $TDL_B$.

The common transmission of the wanted transmit signals in the downlink subbands $DL_A$, $DL_B$ and the correction signal indicative of the intermodulation products in the uplink subbands $UL_A$-$UL_C$ is possible because, for transmission via the transmit chains $TDL_A$, $TDL_B$, the signal levels of the transmit signals and the correction signal may not differ by a large factor such that the dynamic range of the transmit chains $TDL_A$, $TDL_B$ (for example larger than 70 dBc) is sufficient.

From the transmit chains $TDL_A$, $TDL_B$ analog RF output signals are fed to splitters $234_A$, $234_B$, in which the RF signals are split. For each transmit chain $TDL_A$, $TDL_B$, the output RF signal is, in one path, passed through a filter $235_A$, $235_B$, through pre-amplification stages 231 and to a power amplifier 209. By means of the filters $235_A$, $235_B$ all signal components outside of the downlink subbands $DL_A$, $DL_B$ are suppressed such that only the wanted transmit signals in the downlink subbands $DL_A$, $DL_B$ are fed to the respective power amplifier 209. Hence, only the wanted transmit signals in the downlink subbands $DL_A$, $DL_B$ are power amplified by means of the power amplifiers 209.

In another path, the RF signals output from the two transmit chains $TDL_A$, $TDL_B$ are, upon passing the splitters $234_A$, $234_B$, combined in an (analog) combiner 236 and are adjusted in their gain in a programmable gain stage 237.

The output of the two power amplifiers 209 corresponding to the two transmit chains $TDL_A$, $TDL_B$ are combined in a diplexer 238 for transmission via the output antenna 110. Prior to transmission, the signal output from the programmable gain stage 237 is added to the transmit signal in the coupler 218. The signal output from the programmable gain stage 237 corresponds to the correction signal containing the intermodulation products produced by the power amplifiers 209 (as modelled by the power amplifier model 213), which are cancelled out in the transmit signal by adding the signal through the coupler 218 to the transmit signal.

Because only the wanted transmit signals in the downlink subbands $DL_A$, $DL_B$ are amplified in the pre-amplification stages 231 and power amplifiers 209, the difference in signal level between the wanted transmit signal and the correction signal (passed via the coupler 236 and the programmable gain stage 137) is increased by the gain introduced via the pre-amplification stages 231 and the power amplifiers 209. The programmable gain stage 237 in addition serves to adjust the level of the correction signal for proper cancellation.

In another aspect, the power amplifier model 213 as described above may be variable over time and hence may be adjusted during operation. This may be due for example to a temperature drift of a used power amplifier 209, which may alter the operational characteristics of the power amplifier 209 and may hence make an adjustment of the power amplifier model 213 necessary. Such dynamic adjustment may be performed by measuring characteristic operational parameters of the power amplifier 209 during operation and by taking these measured parameters into account for adjusting the power amplifier model 213. For this, signals prior to and after the power amplifier 209 may be measured and used to calculate parameters indicating the transfer characteristic of the power amplifier 209.

Measurements of this kind may also be used in a calibrational step prior to operation of the system to measure characteristic parameters of one or multiple power amplifiers 209 used in the system in order to deduce parameters for the power amplifier model 213.

The instant invention is not limited to the embodiments described above, but may be implemented in an entirely different fashion.

In principle, the invention is not limited to repeater systems, but may be used in entirely different systems employing a transmitter device including a power amplification.

LIST OF REFERENCE NUMERALS

1 System
10 Host unit
100 Antenna
11 Remote unit
110 Antenna
12 Transport medium
20 Receiving section
21 Transmitting section
201 RF filter
202 Low-noise amplifier
203 Downconverter
204 Analog-to-digital converter
205, 206 Digital signal processor (DSP)
207 Digital-to-analog converter
208 Upconverter
209 Power amplifier
210 RF filter
$211_A$, $211_B$ Filter
212 Combiner
213 Non-linear power amplifier model
214 Combiner
$215_A$-$215_N$ Filter
216 Combiner
217 Cross-coupler
218 Coupler
$219_A$-$219_M$ Filter
$220_A$-$220_M$ Upsampler
$221_A$-$221_M$ Modulator
$222_A$-$222_N$ Demodulator
$223_A$-$223_N$ Filter
$224_A$-$224_N$ Downsampler
$225_A$-$225_N$ Upsampler
$226_A$-$226_N$ Modulator
227 Combiner
228 Lookup table
229 Digital-to-analog converter
230 Filter
231 Pre-amplification stages
232 Combiner
$233_A$, $233_B$ Filter
$234_A$, $234_B$ Splitter
$235_A$, $235_B$ Filter
236 Combiner
237 Programmable gain stage
4 Building
40 Floor
D Downlink direction
$DL_A$, $DL_B$ Downlink band
f Frequency
I In-phase component
$IF_{IN}$ IF input signal
$IF_{OUT}$ IF output signal
IM Intermodulation products
L1-L3 Limit
NF Transmitter noise floor
Q Quadrature component
$RF_{IN}$ RF input signal
$RF_{OUT}$ RF output signal
$TDL_A$, $TDL_B$, TUL Transmission chain
U Uplink direction
$UL_A$, $UL_B$, $UL_C$ Uplink band

The invention claimed is:

1. An apparatus, comprising:
a power amplifier;
a processing system;
wherein the processing system comprises:
at least one first link band filter;
a non-linear power amplifier modelling system;
a first combiner, coupled to the at least one first link band filter and the non-linear power amplifier modelling system, and configured to generate a correction signal; and
at least one second link band filter coupled to the first combiner;
at least one first link transmit chain circuit, where each first link transmit chain circuit is coupled to the at least one first link band filter;
wherein the at least one first link transmit chain circuit is coupled to the power amplifier;
a second link transmit chain circuit coupled to the at least one second link band filter; and
a first coupler coupled between the power amplifier and the second link transmit chain circuit.

2. The apparatus of claim 1, wherein the processing system further comprises a second combiner configured to combine an output of each first link band filter; and
wherein the second combiner is coupled between the at least one first link band filter and the first combiner.

3. The apparatus of claim 1, wherein the processing system further comprises a third combiner configured to combine an output of each second link band filter; and
wherein the third combiner is coupled between the at least one second link band filter and the second link transmit chain circuit.

4. The apparatus of claim 1, further comprising a second coupler configured to combine outputs of each first link transmit chain circuit.

5. The apparatus of claim 4, wherein the second coupler is a cross coupler.

6. The apparatus of claim 1, further comprising at least one pre-amplifier coupled between the at least one first link transmit chain circuit and the power amplifier.

7. The apparatus of claim 1, further comprising a filter coupled between the power amplifier and the first coupler.

8. The apparatus of claim 1, wherein each first link band filter has a passband corresponding to a unique downlink subband; and
wherein each second link band filter has a passband corresponding to a unique uplink subband.

9. An apparatus, comprising:
at least two power amplifiers;
a processing system;

wherein the processing system comprises:
- at least two first link band filters;
- a first combiner configured to combine an output of each first link band filter;
- a non-linear power amplifier modelling system;
- a second combiner coupled to the first combiner and the non-linear power amplifier modelling system, and configured to generate a correction signal; and
- at least one second link band filter coupled to the second combiner;

at least two first link transmit chain circuits, where each first link transmit chain circuit is coupled to a unique first link band filter;

wherein each first link transmit chain circuit is coupled to a unique power amplifier;

a second link transmit chain circuit coupled to the at least one second link band filter;

a third combiner configured to combine outputs of each power amplifier; and a coupler coupled between the third combiner and the second link transmit chain circuit.

10. The apparatus of claim 9, wherein the processing system further comprises a fourth combiner configured to combine an output of each second link band filter; and
wherein the fourth combiner is coupled between the at least one second link band filter and the second link transmit chain circuit.

11. The apparatus of claim 9, wherein the third combiner is a diplexer.

12. The apparatus of claim 9, further comprising at least one pre-amplifier, where each pre-amplifier is coupled between a unique first link transmit chain circuit and a unique power amplifier.

13. The apparatus of claim 9, wherein each first link band filter has a passband corresponding to a unique downlink subband; and
wherein each second link band filter has a passband corresponding to a unique uplink subband.

14. An apparatus, comprising:
- at least two power amplifiers;
- a processing system;

wherein the processing system comprises:
- at least two first link band filters;
- a first combiner configured to combine an output of each first link band filter;
- a non-linear power amplifier modelling system;
- at least one second link band filter coupled to the non-linear power amplifier modelling system; and
- a second combiner coupled to the at least one second link band filter;

at least two link transmit chain circuits, where each link transmit chain circuit is coupled to the first combiner and the second combiner;

at least two splitters, where each splitter is coupled to a unique link transmit chain circuit and a unique power amplifier;

a third combiner coupled to the at least two splitters;

a fourth combiner configured to combine the outputs of each power amplifier; and a coupler coupling the third combiner and the fourth combiner.

15. The apparatus of claim 14, wherein the processing system further comprises a fifth combiner; and
wherein the fifth combiner is configured to combine outputs of the first combiner and the second combiner.

16. The apparatus of claim 15, wherein the processing system further comprises at least two filter, where each filter is coupled between the fifth combiner and a unique link transmit chain circuit.

17. The apparatus of claim 14, further comprising at least two filters, where each filter is coupled between a unique splitter and a unique power amplifier.

18. The apparatus of claim 14, further comprising at least one pre-amplifier, where each pre-amplifier is coupled between a unique splitter and a unique power amplifier.

19. The apparatus of claim 14, wherein the fourth combiner is a diplexer.

20. The apparatus of claim 14, wherein each first link band filter has a passband corresponding to a unique downlink subband; and
wherein each second link band filter has a passband corresponding to a unique uplink subband.

* * * * *